United States Patent
Hama et al.

(10) Patent No.: US 11,887,824 B2
(45) Date of Patent: Jan. 30, 2024

(54) METHOD OF CLEANING PLASMA PROCESSING APPARATUS AND PLASMA PROCESSING APPARATUS

(71) Applicant: Tokyo Electron Limited, Tokyo (JP)

(72) Inventors: Yasutaka Hama, Hsin-chu (TW); Nobuaki Shindo, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 7 days.

(21) Appl. No.: 17/443,561

(22) Filed: Jul. 27, 2021

(65) Prior Publication Data
US 2022/0037133 A1    Feb. 3, 2022

(30) Foreign Application Priority Data

Aug. 3, 2020 (JP) ................................ 2020-131871

(51) Int. Cl.
    *H01J 37/32*       (2006.01)
    *H01L 21/02*       (2006.01)

(52) U.S. Cl.
CPC ............... *H01J 37/32862* (2013.01); *H01J 37/32642* (2013.01); *H01J 37/32715* (2013.01); *H01L 21/02046* (2013.01); *H01J 2237/332* (2013.01); *H01J 2237/335* (2013.01)

(58) Field of Classification Search
CPC .......... H01J 37/32862; H01J 37/32642; H01J 37/32715; H01J 2237/332; H01J 2237/335; H01L 21/02046
See application file for complete search history.

(56) References Cited

U.S. PATENT DOCUMENTS

| | | | | |
|---|---|---|---|---|
| 2012/0211163 A1* | 8/2012 | Kobayashi | ........ | H01L 21/67207 156/345.24 |
| 2014/0041682 A1* | 2/2014 | Monden | ............ | H01J 37/32862 134/1 |
| 2015/0179408 A1* | 6/2015 | Shimomura | ....... | H01J 37/32211 438/758 |
| 2021/0272782 A1* | 9/2021 | Koshimizu | ....... | H01J 37/32568 |
| 2022/0301850 A1* | 9/2022 | Kuribayashi | ....... | H01J 37/3244 |

FOREIGN PATENT DOCUMENTS

| | | | | |
|---|---|---|---|---|
| JP | 05-074739 A | | 3/1993 | |
| JP | 2005142200 A | * | 6/2005 | ........... H01L 21/205 |
| JP | 2019-511843 A | | 4/2019 | |

OTHER PUBLICATIONS

Machine translation of JP-2005142200-A (Year: 2005).*

* cited by examiner

*Primary Examiner* — Erin F Bergner
(74) *Attorney, Agent, or Firm* — Nath, Goldberg & Meyer; Jerald L. Meyer; Tanya E. Harkins

(57) ABSTRACT

A method of cleaning a plasma processing apparatus includes: disposing a first dummy substrate at a first position with respect to a stage inside a chamber and performing a first dry cleaning process inside the chamber; and disposing a second dummy substrate at a second position with respect to the stage inside the chamber and performing a second dry cleaning process inside the chamber, wherein each of a center of the first position and a center of the second position is located at a different position from a center of the stage in a plan view, and wherein the first position and the second position are different from each other in a plan view.

19 Claims, 14 Drawing Sheets

METHOD OF CLEANING PLASMA PROCESSING APPARATUS AND PLASMA PROCESSING APPARATUS

CROSS-REFERENCE TO RELATED APPLICATION

This application is based upon and claims the benefit of priority from Japanese Patent Application No. 2020-131871, filed on Aug. 3, 2020, the entire contents of which are incorporated herein by reference.

TECHNICAL FIELD

The present disclosure relates to a method of cleaning a plasma processing apparatus and a plasma processing apparatus.

BACKGROUND

Patent Document 1 discloses a method of dry-cleaning an interior of a vacuum processing chamber of a vacuum processing apparatus. This dry cleaning method is performed in a state in which a dummy wafer is placed on a sample stage inside the vacuum processing chamber.

Patent Document 2 discloses a method of dry-cleaning an interior of a plasma processing chamber of a plasma processing system. This dry cleaning method is so-called waferless dry cleaning, and is performed without placing a dummy wafer on a susceptor inside the plasma processing chamber.

PRIOR ART DOCUMENTS

Patent Documents

Patent Document 1: Japanese Laid-Open Patent Publication No. H5-74739
Patent Document 2: Japanese Laid-Open Patent Publication No. 2019-511843

SUMMARY

An aspect of the present disclosure provides a method of cleaning a plasma processing apparatus. The method includes: disposing a first dummy substrate at a first position with respect to a stage inside a chamber and performing a first dry cleaning process inside the chamber; and disposing a second dummy substrate at a second position with respect to the stage inside the chamber and performing a second dry cleaning process inside the chamber, wherein each of a center of the first position and a center of the second position is located at a different position from a center of the stage in a plan view, and wherein the first position and the second position are different from each other in a plan view.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
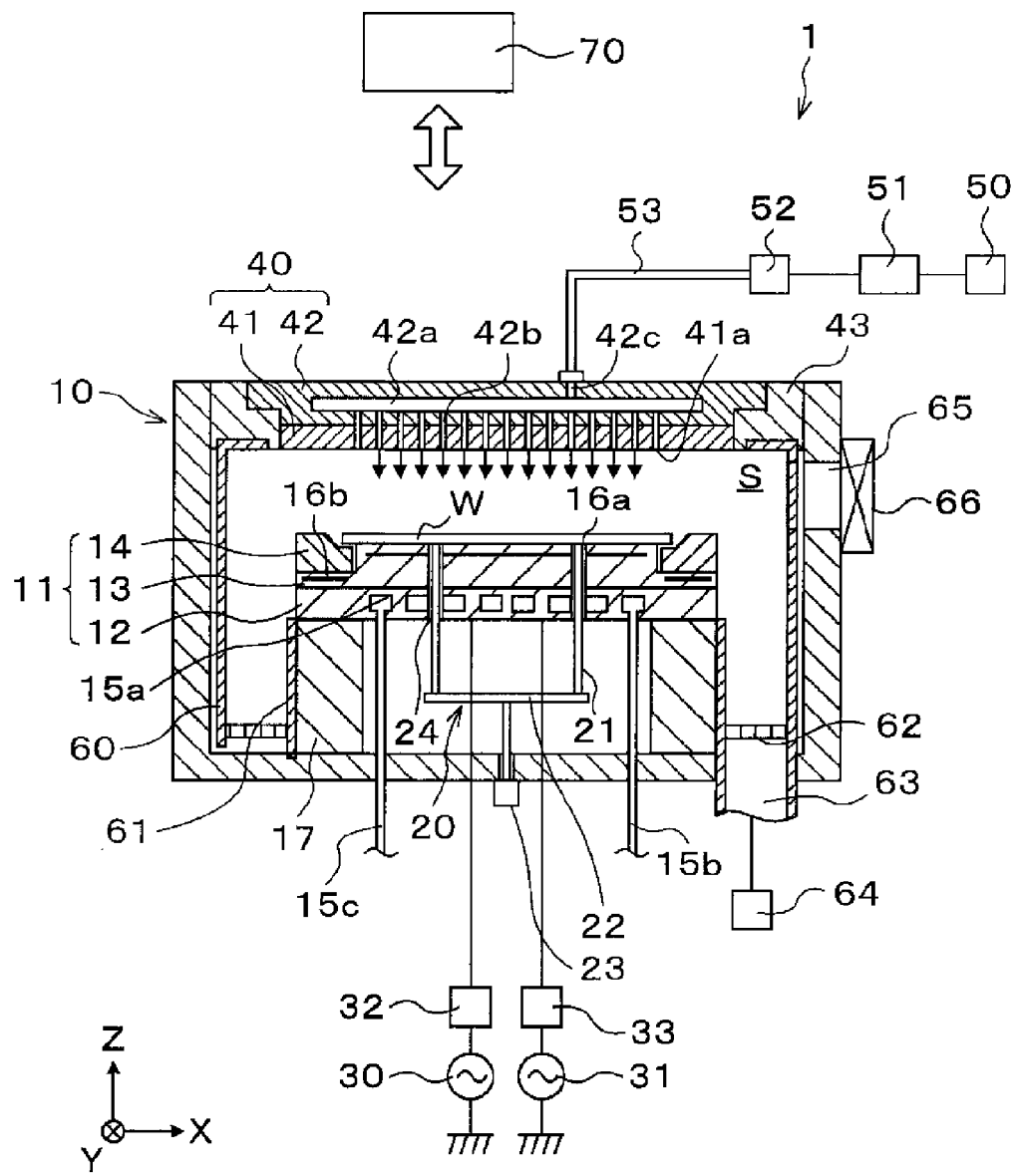
FIG. 1 is a vertical cross-sectional view showing an outline of a configuration of a plasma processing apparatus according to the present embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device manufacturing process, a semiconductor wafer (hereinafter referred to as "wafer") is subjected to plasma processing. In the plasma processing, plasma is generated by exciting a processing gas, and the wafer is processed by the plasma.

The plasma processing is performed by a plasma processing apparatus. The plasma processing apparatus generally includes a chamber, a stage, and a radio frequency (RF) power supply. In one example, the radio frequency power supply includes a first radio frequency power supply and a second radio frequency power supply. The first radio frequency power supply supplies first radio frequency power to generate plasma of a gas in the chamber. The second radio frequency power supply supplies second radio frequency power for bias to a lower electrode in order to attract ions to the wafer. The chamber defines its internal space as a processing space in which plasma is generated. The stage is provided in the chamber. The stage includes a lower electrode and an electrostatic chuck. The electrostatic chuck is provided on the lower electrode. An edge ring is arranged on the electrostatic chuck so as to surround the wafer mounted on the electrostatic chuck. The edge ring is provided to control a sheath shape in a vicinity of an end portion of the wafer and to improve uniformity of plasma processing on the wafer.

Plasma processing produces reaction products. The reaction products adhere to an inner wall of the chamber, the edge ring, and the like, and are deposited as deposits. The deposits are a cause of generation of foreign substances (hereinafter referred to as "particles"), which may cause a decrease in product yield and a decrease in apparatus operating time. Therefore, in order to remove the deposits, a dry cleaning process using plasma is performed inside the chamber. That is, in the dry cleaning process, a dry cleaning gas is excited to generate plasma, and the plasma is used to remove the deposits. Specifically, the dry cleaning process removes the deposits by a chemical reaction with radicals and a physical reaction (sputtering) with ions.

The dry cleaning process may be performed in a state in which a dummy wafer is mounted on a stage as disclosed in Patent Document 1. Further, as disclosed in Patent Document 2, the dry cleaning process may be performed in a state in which a dummy wafer is not placed on a stage (wafer-less dry cleaning).

In the dry cleaning process using the dummy wafer, radicals and ions are blocked by the dummy wafer, and a region where the radicals and ions are difficult to be supplied (a region where radicals and ions are difficult to be incident) is generated. In particular, when the second radio frequency power (bias power) is supplied to the lower electrode of the stage, the ions travel straight toward the dummy wafer. Therefore, efficiency of sputtering by the ions is significantly reduced in the region shielded by the dummy wafer. For this reason, deposits (e.g., deposits containing Si or metal) that are difficult to remove by a chemical reaction with radicals cannot be sufficiently removed.

Further, in the wafer-less dry cleaning process without using the dummy wafer, the dummy wafer is not mounted on the stage (electrostatic chuck) so that ions are directly incident on a front surface of the stage. Therefore, when the bias power is increased, the stage is damaged. For that reason, it is necessary to lower the bias power, which lowers the efficiency of sputtering by ions. In addition, deposits (e.g., deposits containing Si or metal) that are difficult to remove by a chemical reaction with radicals cannot be sufficiently removed.

The technique according to the present disclosure appropriately dry-cleans a stage for mounting a substrate thereon inside a chamber of a plasma processing apparatus. Hereinafter, a plasma processing apparatus and a method of dry-cleaning the plasma processing apparatus according to the present embodiment will be described with reference to the drawings. In the present specification and the drawings, elements having substantially the same functional configuration are designated by like reference numerals, and a redundant description thereof will be omitted.

<Plasma Processing Apparatus>

First, a plasma processing apparatus according to the present embodiment will be described. FIG. 1 is a vertical cross-sectional view showing an outline of a configuration of a plasma processing apparatus 1. The plasma processing apparatus 1 is a capacitively-coupled plasma processing apparatus. Further, in the plasma processing apparatus 1, plasma processing is performed on a product wafer W as a product substrate. The product wafer W is a wafer on which desired plasma processing is performed, for example, a wafer having a pattern formed on a surface thereof. The plasma processing is not particularly limited. For example, an etching process, a film-forming process, a diffusing process, and the like are performed.

As shown in FIG. 1, the plasma processing apparatus 1 includes a chamber 10 having a substantially cylindrical shape. The chamber 10 defines a processing space S in which plasma is generated. The chamber 10 is formed of, for example, aluminum. The chamber 10 is connected to a ground potential. A plasma-resistant film is formed on an inner wall surface of the chamber 10, i.e., a wall surface that defines the processing space S. This film may be a ceramic film such as a film formed by an anodic oxidation process or a film formed from yttrium oxide.

Inside the chamber 10, a stage 11 on which the product wafer W is mounted is accommodated. The stage 11 has a lower electrode 12, an electrostatic chuck 13, and an edge ring 14. An electrode plate (not shown) formed of, for example, aluminum may be provided on a side of a back surface of the lower electrode 12.

The lower electrode 12 is formed of a conductive metal such as aluminum or the like and has a substantially disk-like shape.

A coolant flow path 15a is formed inside the lower electrode 12. A coolant is supplied to the coolant flow path 15a from a chiller unit (not shown) provided outside the chamber 10 via a coolant inlet pipe 15b. The coolant supplied to the coolant flow path 15a returns to the chiller unit via a coolant outlet flow path 15c. By circulating the coolant such as cooling water or the like through the coolant flow path 15a, it is possible to cool the electrostatic chuck 13, the edge ring 14, and the product wafer W to a desired temperature.

The electrostatic chuck 13 is provided on the lower electrode 12. The electrostatic chuck 13 is a member configured to be able to attract and hold both the product wafer W and the edge ring 14 by an electrostatic force. A surface of a central portion of the electrostatic chuck 13 is formed higher than a surface of an outer peripheral portion thereof. The surface of the central portion of the electrostatic chuck 13 serves as a wafer mounting surface on which the product wafer W is mounted, and the surface of the outer peripheral portion of the electrostatic chuck 13 serves as an edge ring mounting surface on which the edge ring 14 is mounted. The details of the configuration of the electrostatic chuck 13 will be described later.

A first electrode 16a for attracting and holding the product wafer W is provided at the central portion inside the electrostatic chuck 13. A second electrode 16b for attracting and holding the edge ring 14 is provided at the outer peripheral portion inside the electrostatic chuck 13. The electrostatic chuck 13 has a configuration in which the electrodes 16a and 16b are sandwiched between insulating members formed of an insulating material.

A DC voltage from a DC power supply (not shown) is applied to the first electrode 16a. Due to the electrostatic force thus generated, the product wafer W is attracted and held on the surface of the central portion of the electrostatic chuck 13. Similarly, a DC voltage from a DC power supply (not shown) is applied to the second electrode 16b. Due to the electrostatic force thus generated, the edge ring 14 is attracted and held on the surface of the outer peripheral portion of the electrostatic chuck 13.

The edge ring 14 is an annular member arranged so as to surround the product wafer W mounted on the surface of the central portion of the electrostatic chuck 13. The edge ring 14 is provided to improve uniformity of plasma processing. Therefore, the edge ring 14 is formed of a material appropriately selected according to the plasma processing, and may be formed of, for example, quartz, Si, SiC, or the like. The details of the configuration of the edge ring 14 will be described later.

The stage 11 configured as described above is fastened to a substantially cylindrical support 17 provided at a bottom portion of the chamber 10. The support 17 is formed of an insulator such as ceramic or quartz.

Although not shown, the stage 11 may include a temperature adjustment module configured to adjust the temperature of at least one of the electrostatic chuck 13, the edge ring 14, and the product wafer W to a desired temperature. The temperature adjustment module may include a heater, a flow path, or a combination thereof. A temperature adjustment fluid such as a coolant or a heat transfer gas flows through the flow path.

A lifter 20 for raising and lowering the product wafer W with respect to the stage 11 is provided below the stage 11 and inside the support 17. The lifter 20 includes lift pins 21, a support member 22, and a drive part 23.

The lift pins 21 are columnar members configured to move up and down so as to protrude or retract from the surface of the central portion of the electrostatic chuck 13, and are formed of, for example, ceramic. Three or more lift pins 21 are provided at intervals from one another along a circumferential direction of the electrostatic chuck 13, i.e., a circumferential direction of the surface. The lift pins 21 are provided, for example, at equal intervals along the circumferential direction. The lift pins 21 are provided so as to extend in a vertical direction.

The lift pins 21 are inserted into through-holes 24 extending downward from the surface of the central portion of the electrostatic chuck 13 to a bottom surface of the lower electrode 12. That is, the through-holes 24 are formed so as to penetrate the central portion of the electrostatic chuck 13 and the lower electrode 12.

The support member 22 supports the lift pins 21. The drive part 23 generates a driving force for raising and lowering the support member 22, and raises and lowers the lift pins 21. The drive part 23 includes a motor (not shown) that generates the driving force.

The plasma processing apparatus 1 further includes a first radio frequency (RF) power supply 30, a second radio frequency power supply 31, a first matcher 32, and a second matcher 33. The first radio frequency power supply 30 and the second radio frequency power supply 31 are coupled to the lower electrode 12 via the first matcher 32 and the second matcher 33, respectively.

The first radio frequency power supply 30 is a power supply configured to generate radio frequency power for plasma generation. Radio frequency power HF having a frequency of 27 MHz to 100 MHz, for example, 40 MHz, is supplied from the first radio frequency power supply 30 to the lower electrode 12. The first matcher 32 includes a circuit for matching an output impedance of the first radio frequency power supply 30 with an input impedance on a side of a load (the lower electrode 12). The first radio frequency power supply 30 does not have to be electrically connected to the lower electrode 12, and may be connected to a shower head 40, which is an upper electrode, via the first matcher 32.

The second radio frequency power supply 31 generates radio frequency power (bias power) LF for drawing ions onto the product wafer W, and supplies the radio frequency power LF to the lower electrode 12. A frequency of the radio frequency power LF may be in a range of 400 kHz to 13.56 MHz, for example, 400 kHz. The second matcher 33 includes a circuit for matching an output impedance of the second radio frequency power supply 31 with the input impedance on the side of the load (the lower electrode 12). A DC (Direct Current) pulse generator may be used instead of the second radio frequency power supply 31.

The shower head 40 is provided above the stage 11 so as to face the stage 11. The shower head 40 includes an electrode plate 41 arranged so as to face the processing space S, and an electrode support 42 provided above the electrode plate 41. The electrode plate 41 functions as an upper electrode that forms a pair together with the lower electrode 12. When the first radio frequency power supply 30 is electrically connected to the lower electrode 12 as described later, the shower head 40 is connected to the ground potential. The shower head 40 is supported on an upper portion (ceiling surface) of the chamber 10 via an insulating shield 43.

A plurality of gas discharge holes 41a for supplying the processing gas sent from a gas diffusion chamber 42a, which will be described later, to the processing space S is formed in the electrode plate 41. The electrode plate 41 is formed of, for example, a conductor or a semiconductor having a low electrical resistivity with low Joule heat generated.

The electrode support 42 is configured to detachably support the electrode plate 41. The electrode support 42 has a configuration in which a plasma-resistant film is formed on a surface of a conductive material such as aluminum or the like. This film may be a ceramic film such as a film formed by an anodic oxidation process or a film formed from yttrium oxide. The gas diffusion chamber 42a is formed inside the electrode support 42. A plurality of gas flow holes 42b in communication with the gas discharge holes 41a is formed to extend from the gas diffusion chamber 42a. Further, a gas introduction hole 42c connected to a gas supply pipe 53, which will be described later, is formed in the gas diffusion chamber 42a.

Further, a gas source group 50 for supplying the processing gas to the gas diffusion chamber 42a is connected to the electrode support 42 via a flow rate controller group 51, a valve group 52, the gas supply pipe 53, and the gas introduction hole 42c.

The gas source group 50 includes a plurality of gas sources for a plurality of gas types necessary for plasma processing or dry cleaning. The flow rate controller group 51 includes a plurality of flow rate controllers, and the valve group 52 includes a plurality of valves. Each of the flow rate controllers in the flow rate controller group 51 is a mass flow controller or a pressure control type flow rate controller. In the plasma processing apparatus 1, the processing gas coming from one or more gas sources selected from the gas source group 50 is supplied to the gas diffusion chamber 42a via the flow rate controller group 51, the valve group 52, the gas supply pipe 53, and the gas introduction hole 42c. Then, the processing gas supplied to the gas diffusion chamber 42a is dispersed and supplied in a shower shape into the processing space S through the gas flow holes 42b and the gas discharge holes 41a.

A deposit shield 60 is detachably provided along the inner wall of the chamber 10 in the plasma processing apparatus 1. The deposit shield 60 is configured to suppress deposits from adhering to the inner wall of the chamber 10, and is formed by, for example, coating an aluminum material with ceramics such as yttrium oxide or the like. Similarly, a deposit shield 61 is detachably provided on an outer peripheral surface of the support 17, which is a surface facing the deposit shield 60.

A baffle plate 62 is provided at the bottom portion of the chamber 10 between the inner wall of the chamber 10 and the support 17. The baffle plate 62 is formed by, for example, coating an aluminum material with ceramics such as yttrium oxide or the like. A plurality of through-holes is formed in the baffle plate 62. The processing space S is in communication with an exhaust port 63 via the baffle plate 62. An exhaust device 64 such as a vacuum pump or the like is connected to the exhaust port 63, and the exhaust device 64 is configured to be able to reduce a pressure in the processing space S.

Further, a loading and unloading port 65 for the product wafer W is formed on a side wall of the chamber 10, and the loading and unloading port 65 can be opened and closed by a gate valve 66.

In the present embodiment, a dry cleaning part includes the lower electrode 12, the second radio frequency power supply 31, the gas source group 50, and the like, and excites a dry cleaning gas and generates plasma in order to dry-clean the interior of the chamber 10 as described later.

The plasma processing apparatus 1 described above is provided with a controller 70. The controller 70 is, for example, a computer equipped with a CPU, a memory, and the like, and includes a program storage (not shown). The program storage stores a program that controls plasma processing in the plasma processing apparatus 1. The program may be recorded in a non-transitory computer-readable storage medium and may be installed on the controller 70 from the storage medium.

<Plasma Processing Method>

Next, the plasma processing performed by using the plasma processing apparatus 1 configured as described above will be described.

First, the product wafer W is loaded into the chamber 10 and is mounted on the electrostatic chuck 13. At this time, the product wafer W is mounted on the electrostatic chuck 13 so that a center of the product wafer W is located at the same position as a center of the electrostatic chuck 13 in a plan view. This position of the product wafer W is a processing position in the present disclosure. Thereafter, by applying a DC voltage to the first electrode 16a of the electrostatic chuck 13, the product wafer W is electrostatically attracted to and held by the electrostatic chuck 13 by a Coulomb force. After the product wafer W is loaded, the interior of the chamber 10 is depressurized to a desired degree of vacuum by the exhaust device 64.

Subsequently, the processing gas is supplied from the gas source group 50 to the processing space S via the shower head 40. Further, the radio frequency power HF for plasma generation is supplied to the lower electrode 12 by the first radio frequency power supply 30, whereby the processing gas is excited to generate plasma. At this time, the radio frequency power LF for attracting ions may be supplied by the second radio frequency power supply 31. Then, the product wafer W is subjected to plasma processing by the action of the generated plasma.

When the plasma processing is completed, first, the supply of the radio frequency power HF from the first radio frequency power supply 30 and the supply of the processing gas by the gas source group 50 are stopped. Further, when the radio frequency power LF is supplied during the plasma processing, the supply of the radio frequency power LF is also stopped. Subsequently, supply of a heat transfer gas to a back surface of the product wafer W is stopped, and the operation of attracting and holding the product wafer W by the electrostatic chuck 13 is stopped.

Thereafter, the product wafer W is unloaded from the chamber 10, and a series of plasma processing on the product wafer W is terminated.

In the plasma processing, the plasma may be generated by using only the radio frequency power LF supplied from the second radio frequency power supply 31 without using the radio frequency power HF supplied from the first radio frequency power supply 30.

<Electrostatic Chuck and Edge Ring>

Figure 2:
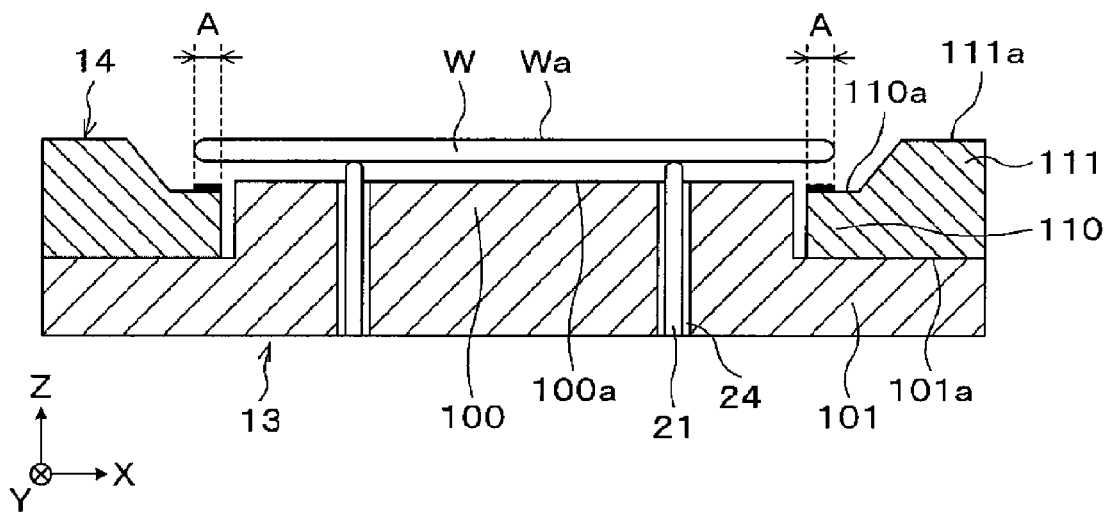
FIG. 2 is a vertical cross-sectional view showing an outline of a configuration of an electrostatic chuck and an edge ring according to the present embodiment.
Figure 3:
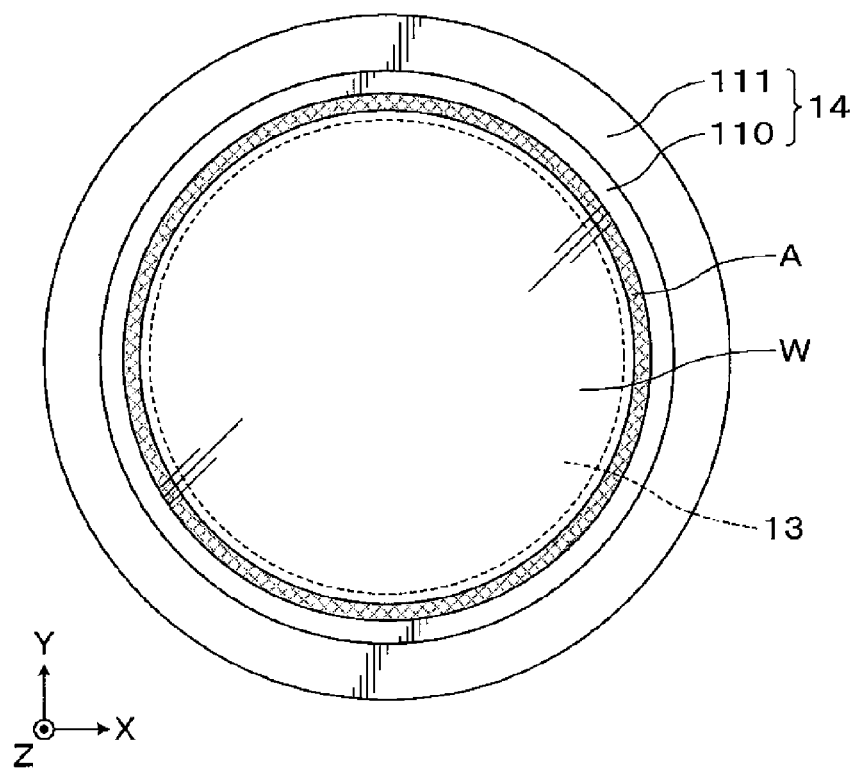
FIG. 3 is a plan view showing the outline of the configuration of the electrostatic chuck and the edge ring according to the present embodiment.

Next, a main configuration of the electrostatic chuck 13 and the edge ring 14 will be described. FIG. 2 is a vertical cross-sectional view showing an outline of the configuration of the electrostatic chuck 13 and the edge ring 14. FIG. 3 is a plan view showing an outline of the configuration of the electrostatic chuck 13 and the edge ring 14.

As shown in FIG. 2, the electrostatic chuck 13 is configured so that a central portion 100 having a surface 100a on which the product wafer W is mounted and an outer peripheral portion 101 having a surface 101a on which the edge ring 14 is mounted are formed integral with each other. The central portion 100 is provided so as to protrude from the outer peripheral portion 101, and the surface 100a of the central portion 100 is higher than the surface 101a of the outer peripheral portion 101.

The central portion 100 of the electrostatic chuck 13 is formed to have, for example, a diameter smaller than a diameter of the product wafer W, and is configured so that when the product wafer W is mounted on the surface 100a, a peripheral edge portion of the product wafer W overhangs from the central portion 100 of the electrostatic chuck 13.

In the electrostatic chuck 13 of the present embodiment, the central portion 100 and the outer peripheral portion 101 are formed integral with each other. However, the central portion 100 and the outer peripheral portion 101 may be separate bodies. Further, although the electrostatic chuck 13 of the present embodiment includes the central portion 100 and the outer peripheral portion 101, the outer peripheral portion 101 may be omitted. In such a case, the edge ring 14 is not mounted on the electrostatic chuck 13 and is supported by another support member (not shown).

The edge ring 14 is provided so as to surround the product wafer W mounted on the surface 100a. The edge ring 14 includes a first ring portion 110 having an annular shape and a second ring portion 111 having an annular shape, which are formed integral with each other. The first ring portion 110 and the second ring portion 111 are provided on concentric circles, respectively, and the second ring portion 111 is provided radially outward of the first ring portion 110.

A surface 110*a* of the first ring portion 110 is lower than the surface 100*a*. A surface 111*a* of the second ring portion 111 is higher than the surface 100*a* and is, for example, flush with or higher than a surface Wa of the product wafer W mounted on the surface 100*a*. In addition, an inner peripheral portion of the surface 111*a* is inclined toward the surface 110*a* (radially inward).

An inner diameter of the first ring portion 110 is larger than the diameter of the central portion 100 and smaller than the diameter of the product wafer W. An inner diameter of the second ring portion 111 is larger than the diameter of the product wafer W. The first ring portion 110 is arranged so as to go under the peripheral edge portion of the product wafer W overhanging from the central portion 100 of the electrostatic chuck 13. That is, as shown in FIGS. 2 and 3, a region that overlaps with the product wafer W in a plan view and becomes a shadow of the product wafer W is formed on the surface 110*a* of the first ring portion 110. In the following description, the region that becomes the shadow of the product wafer W is referred to as a shadow region A.

<Characteristics of Dry Cleaning Process Using Dummy Wafer>

Plasma processing produces reaction products as described above. The reaction products adhere to the edge ring 14 and the like, and are deposited as deposits. Therefore, in order to remove the deposits, a dry cleaning process using plasma is performed inside the chamber 10. The dry cleaning process removes the deposits by a chemical reaction with radicals and a physical reaction with ions (sputtering). In the chemical reaction with radicals, for example, carbon-based deposits can be removed. In addition, in the physical reaction with ions, for example, deposits containing Si or metal can be removed.

Figure 4:
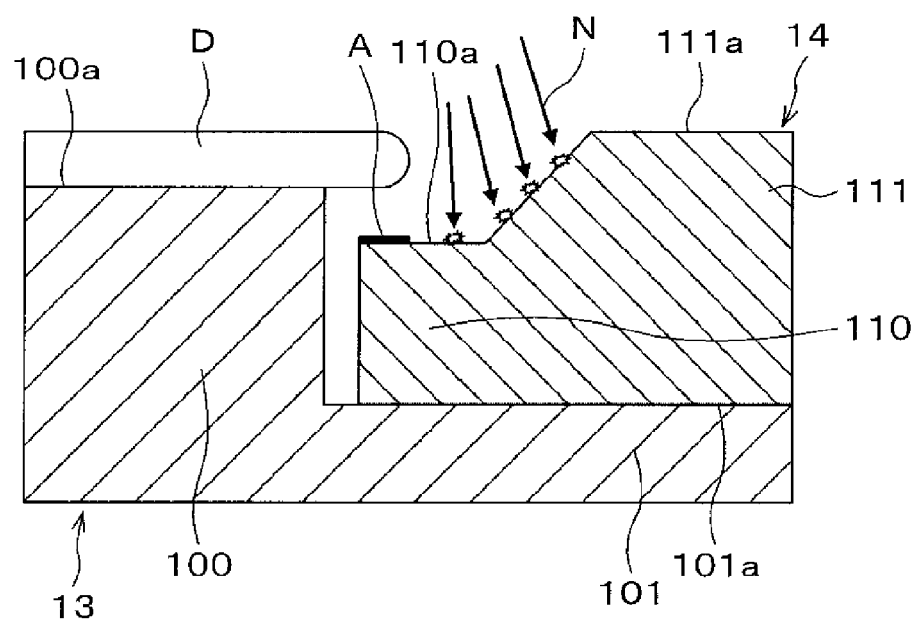
FIG. 4 is an explanatory diagram showing a state in which a dry cleaning process is performed by using a dummy wafer.

In the present embodiment, the dry cleaning process is performed using a dummy wafer. However, in such a case, the radicals and ions are blocked by the dummy wafer, whereby a region where the radicals and ions are difficult to be supplied (a region where the radicals and ions are difficult to be incident) is generated. Hereinafter, the region where the dry cleaning process is difficult to be performed will be described with reference to FIG. 4. FIG. 4 is an explanatory diagram showing a state in which a dry cleaning process is performed using a dummy wafer D. In FIG. 4, the arrows indicate a flow of ions N. Further, in order to facilitate understanding of the technique, a flow of radicals is omitted in FIG. 4. The dummy wafer D is a wafer having the same diameter as that of the product wafer W. In addition, the dummy wafer D is a wafer on which no pattern is formed, and is a so-called bare silicon wafer.

When the dry cleaning process is performed as shown in FIG. 4, the ions N are supplied to the surfaces 110*a* and 111*a* of the edge ring 14, and the deposits adhering to the surfaces 110*a* and 111*a* are removed. However, it is difficult for the ions N to be supplied to the shadow region A, which is a shadow of the dummy wafer D in a plan view. When the radio frequency power LF (bias power) is supplied to the lower electrode 12, the ions N travel straight toward the dummy wafer D. Therefore, efficiency of sputtering by the ions N is significantly reduced in the shadow region A shielded by the dummy wafer D. For this reason, the deposits (e.g., the deposits containing Si or metal) that are difficult to remove by the chemical reaction with radicals cannot be sufficiently removed. Further, the radicals are also difficult to be supplied to the shadow region A, which is the shadow of the dummy wafer D, and the deposits cannot be sufficiently removed.

Therefore, in a dry cleaning method according to a first embodiment, a dummy cleaning process for the shadow region A is performed by shifting a position of the dummy wafer D with respect to the stage 11 (the edge ring 14). Further, in a dry cleaning method according to a second embodiment, a dummy cleaning process for the shadow region A is performed by using a wafer having a diameter smaller than that of the product wafer W (hereinafter referred to as "small-diameter dummy wafer") as the dummy wafer.

<Dry Cleaning Method According to First Embodiment>

Figure 5:
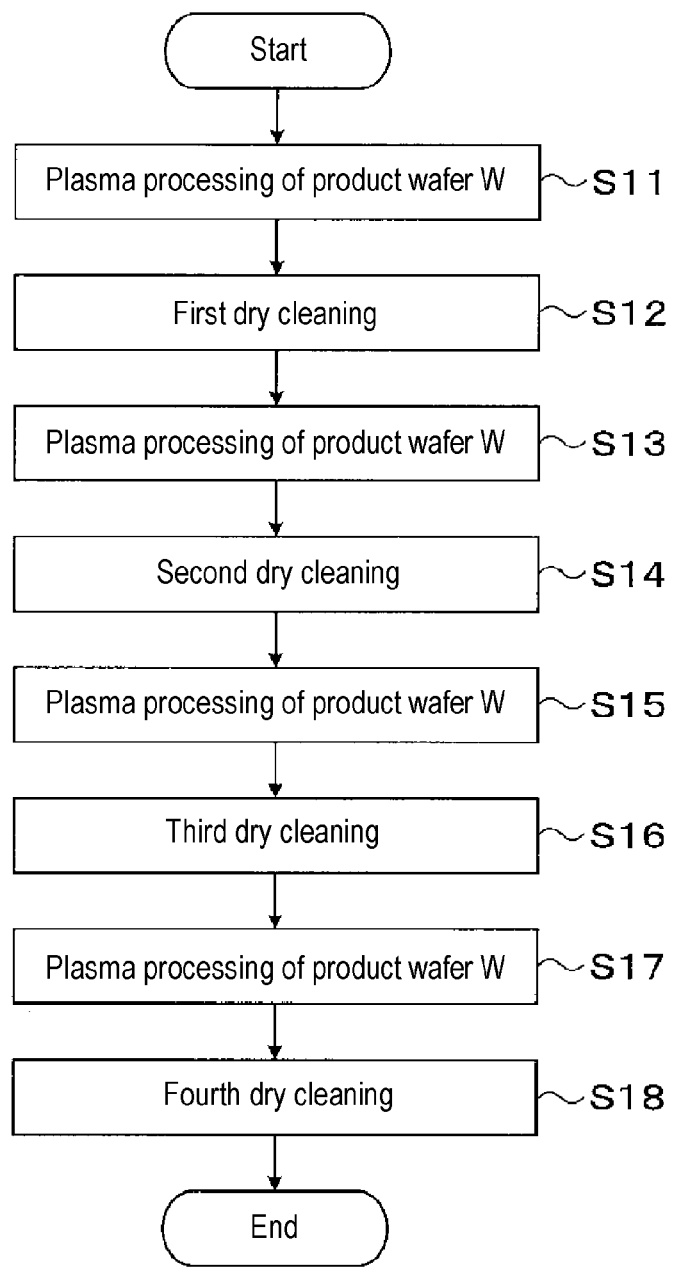
FIG. 5 is a flow chart showing main processes of wafer processing according to a first embodiment.
Figure 6:
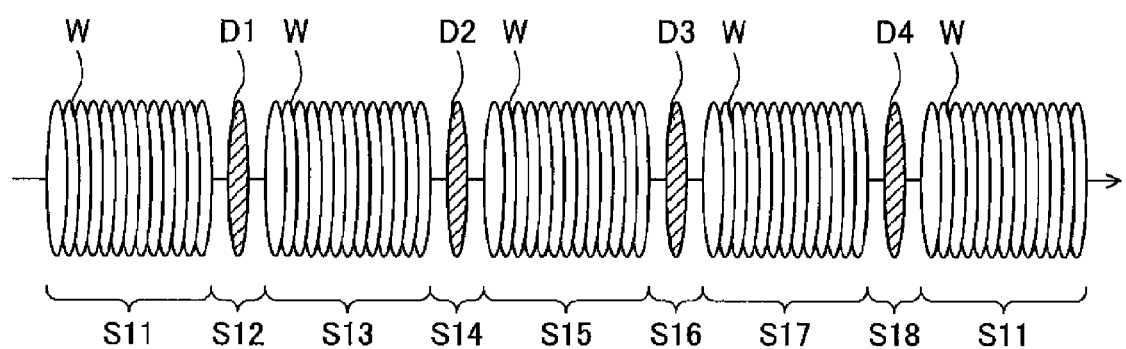
FIG. 6 is an explanatory diagram showing a series of flow of the wafer processing according to the first embodiment through the use of wafers.

A dry cleaning method according to the first embodiment will be described. In the first embodiment, plasma processing for the product wafer W and a dry cleaning process using the dummy wafer D will be described. In the following description, the plasma processing and the dry cleaning process are collectively referred to as wafer processing. FIG. 5 is a flow chart showing main processes of wafer processing according to the first embodiment. FIG. 6 is an explanatory diagram showing a series of flow of the wafer processing according to the first embodiment through the use of wafers. FIGS. 7A to 7D are explanatory views showing positions of a wafer in a dry cleaning process according to the first embodiment.

In the first embodiment, the dry cleaning process is performed by using four dummy wafers D1 to D4 as described later. The first to fourth dummy wafers D1 to D4 have the same diameter as that of the product wafer W. Further, in the first embodiment, the first to fourth dummy wafers D1 to D4 are different dummy wafers, respectively. However, each of the first to fourth dummy wafers D1 to D4 may be the same dummy wafer.

(Step S11)

In step S11, plasma processing is continuously performed on one lot of product wafers W, for example, twenty-five product wafers W. The plasma processing method for each product wafer W is as described above.

(Step S12)

Figure 7A:
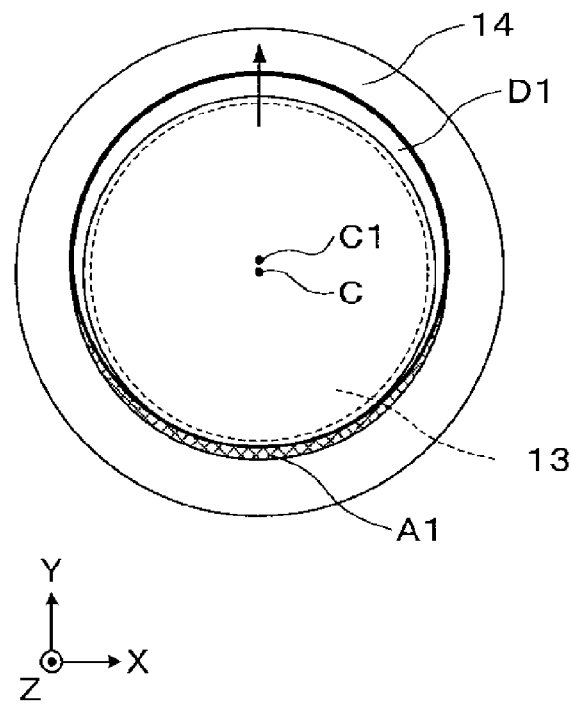
FIGS. 7A to 7D are explanatory diagrams showing positions of a wafer in a dry cleaning process according to the first embodiment.

In step S12, a first dry cleaning process is performed by using the first dummy wafer D1. Specifically, first, the first dummy wafer D1 is loaded into the chamber 10 and is disposed above the electrostatic chuck 13. At this time, as shown in FIG. 7A, the first dummy wafer D1 is disposed so that a center C1 of the first dummy wafer D1 is shifted from a center C of the electrostatic chuck 13 in a positive direction of a Y axis in a plan view. This position of the first dummy wafer D1 is a first position in the present disclosure. In such a case, in the shadow region A of the edge ring 14, a first shadow region A1 on a side of a negative direction of the Y axis is exposed without overlapping with the first dummy wafer D1 in a plan view.

Figure 8:
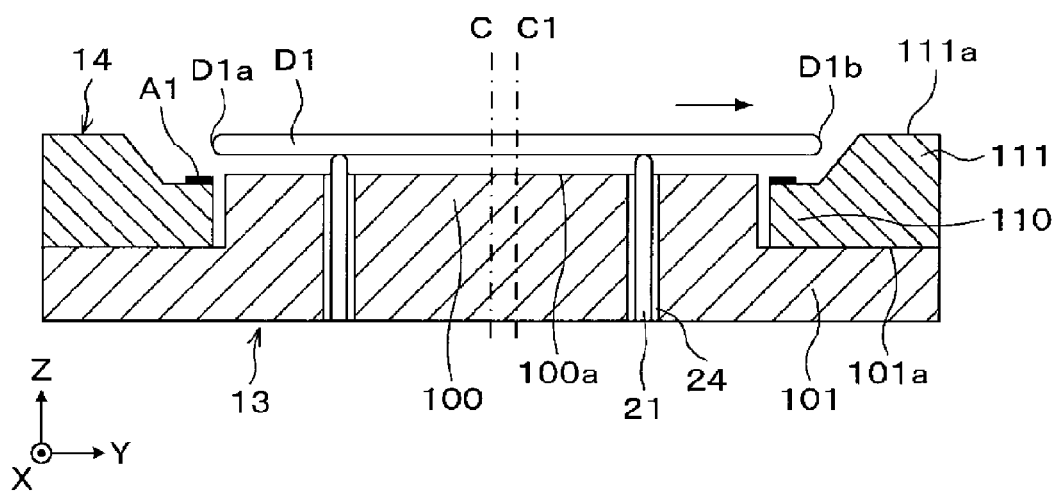
FIG. 8 is an explanatory diagram of a first position in the first embodiment.

The first position where the first dummy wafer D1 is disposed will be described in more detail. As shown in FIG. 8, a first end 1*a* of the first dummy wafer D1 is located between an inner peripheral end of the edge ring 14 and an outer peripheral end of the central portion 100 of the electrostatic chuck 13. Further, a second end D1*b* of the first dummy wafer D1 is located radially outward of the inner peripheral end of the edge ring 14. Thus, in the edge ring 14, the shadow region A1 on a side of the first end D1*a* is exposed without overlapping with the first dummy wafer D1.

Subsequently, the lifter 20 supporting the first dummy wafer D1 is lowered to mount the first dummy wafer D1 on the electrostatic chuck 13. Thereafter, by applying a DC voltage to the first electrode 16a of the electrostatic chuck 13, the first dummy wafer D1 is electrostatically attracted to and held by the electrostatic chuck 13 by a Coulomb force. After the first dummy wafer D1 is loaded, the interior of the chamber 10 is depressurized to a desired degree of vacuum by the exhaust device 64.

Subsequently, a dry cleaning gas is supplied from the gas source group 50 to the processing space S via the shower head 40. Examples of the dry cleaning gas may include oxygen, an oxygen-containing gas, HCl, $F_2$, $Cl_2$, hydrogen, nitrogen, argon, $SF_6$, $C_2F_6$, $NF_3$, $CF_4$, or a mixture of two or more of these gases. Further, radio frequency power is supplied to the lower electrode 12 by the first radio frequency power supply 30 and/or the second radio frequency power supply 31. Then, the dry cleaning gas is excited to generate plasma, and the deposits existing inside the chamber 10 is removed by a chemical reaction with radicals and a physical reaction (sputtering) with ions. At this time, the ions are also supplied to the first shadow region A1 exposed from the first dummy wafer D1, and the deposits adhering to the first shadow region A1 are also removed. The first dry cleaning process is performed as described above.

When the first dry cleaning process is terminated, first, the supply of the radio frequency power from the first radio frequency power supply 30 and/or the second radio frequency power supply 31 and the supply of the processing gas by the gas source group 50 are stopped. Subsequently, the operation of attracting and holding the first dummy wafer D1 by the electrostatic chuck 13 is stopped.

Thereafter, the first dummy wafer D1 is unloaded from the chamber 10, and the first dry cleaning process using the first dummy wafer D1 is terminated.

(Step S13)

In step S13, plasma processing is continuously performed on a subsequent lot of product wafers W, for example, twenty-five product wafers W. This step S13 is the same as step S11.

(Step S14)

Figure 7B:
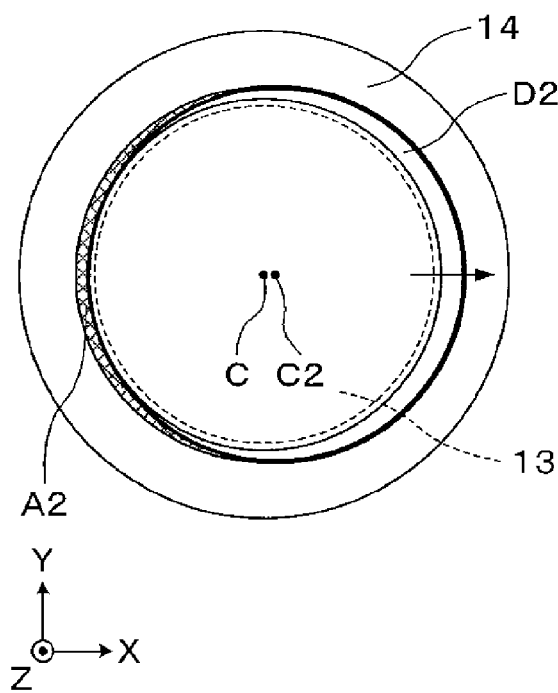

In step S14, a second dry cleaning process is performed by using the second dummy wafer D2. Specifically, first, the second dummy wafer D2 is disposed above the electrostatic chuck 13. At this time, as shown in FIG. 7B, the second dummy wafer D2 is disposed so that a center C2 of the second dummy wafer D2 is shifted from the center C of the electrostatic chuck 13 in a positive direction of an X axis in a plan view. This position of the second dummy wafer D2 is a second position in the present disclosure. In such a case, in the shadow region A of the edge ring 14, a second shadow region A2 on a side of a negative direction of the X axis is exposed without overlapping with the second dummy wafer D2 in a plan view.

Subsequently, the second dummy wafer D2 is mounted on the electrostatic chuck 13, and is attracted and held by the electrostatic chuck 13. Subsequent procedures in the second dry cleaning process are the same as in the first dry cleaning process of step S12. That is, the deposits existing inside the chamber 10 are removed by the plasma (including radicals and ions) generated by exciting the dry cleaning gas. At this time, the deposits adhering to the second shadow region A2 exposed from the second dummy wafer D2 are also removed. The second dry cleaning process is performed as described above.

(Step S15)

In step S15, plasma processing is continuously performed on a subsequent lot of product wafers W, for example, twenty-five product wafers W. This step S15 is the same as step S11.

(Step S16)

Figure 7C:
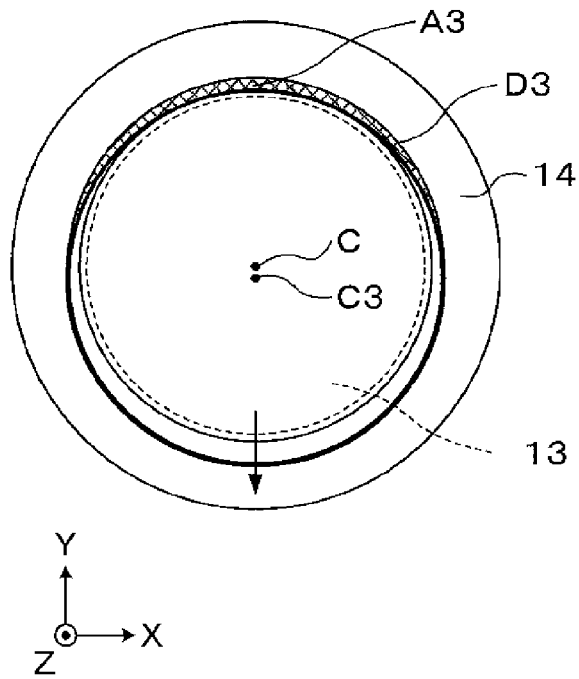

In step S16, a third dry cleaning process is performed by using the third dummy wafer D3. Specifically, first, the third dummy wafer D3 is disposed above the electrostatic chuck 13. At this time, as shown in FIG. 7C, the third dummy wafer D3 is disposed so that a center C3 of the third dummy wafer D3 is shifted from the center C of the electrostatic chuck 13 in the negative direction of the Y axis in a plan view. This position of the third dummy wafer D3 is a third position in the present disclosure. In such a case, in the shadow region A of the edge ring 14, a third shadow region A3 on a side of the positive direction of the Y axis is exposed without overlapping with the third dummy wafer D3 in a plan view.

Subsequently, the third dummy wafer D3 is mounted on the electrostatic chuck 13, and is attracted and held by the electrostatic chuck 13. Subsequent procedures in the third dry cleaning process is the same as in the first dry cleaning process of step S12. That is, the deposits existing inside the chamber 10 are removed by the plasma (including radicals and ions) generated by exciting the dry cleaning gas. At this time, the deposits adhering to the third shadow region A3 exposed from the third dummy wafer D3 are also removed. The third dry cleaning is performed as described above.

(Step S17)

In step S17, plasma processing is continuously performed on a subsequent lot of product wafers W, for example, twenty-five product wafers W. This step S17 is the same as step S11.

(Step S18)

Figure 7D:
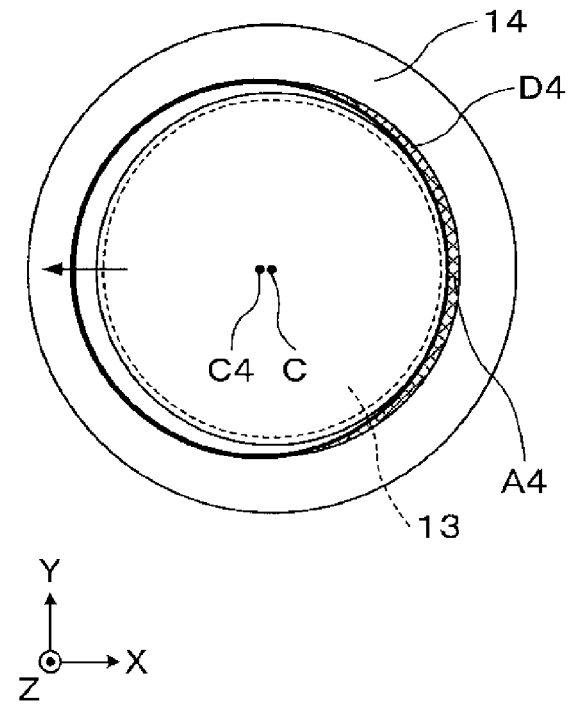

In step S18, a fourth dry cleaning process is performed by using the fourth dummy wafer D4. Specifically, first, the fourth dummy wafer D4 is disposed above the electrostatic chuck 13. At this time, as shown in FIG. 7D, the fourth dummy wafer D4 is disposed so that a center C4 of the fourth dummy wafer D4 is shifted from the center C of the electrostatic chuck 13 in the negative direction of the X axis in a plan view. This position of the fourth dummy wafer D4 is a fourth position in the present disclosure. In such a case, in the shadow region A of the edge ring 14, a fourth shadow region A4 on a side of the positive direction of the X axis is exposed without overlapping with the fourth dummy wafer D4 in a plan view.

Subsequently, the fourth dummy wafer D4 is mounted on the electrostatic chuck 13, and is attracted and held by the electrostatic chuck 13. Subsequent procedures in the fourth dry cleaning process is the same as in the first dry cleaning of step S12. That is, the deposits existing inside the chamber 10 are removed by the plasma (including radicals and ions) generated by exciting the dry cleaning gas. At this time, the deposits adhering to the fourth shadow region A4 exposed from the fourth dummy wafer D4 are also removed. The fourth dry cleaning is performed as described above.

After step S18, for example, steps S11 to S18 are repeated.

As described above, in the first embodiment, the deposits adhering to the first to fourth shadow regions A1 to A4 can be removed by performing the first to fourth dry cleaning processes, respectively. Therefore, the deposits can be appropriately removed even in the shadow region A, which is located behind the dummy wafer D so that the deposits cannot be removed therefrom in the prior art as shown in FIG. 4. In the first embodiment, on the surfaces 110a and 111a of the edge ring 14, portions other than the shadow region A are exposed so that the deposits adhering to these portions can be appropriately removed. Therefore, since the deposits can be removed over the entire surfaces 110a and 111a of the edge ring 14, it is possible to suppress generation of particles and to improve yield of products. In addition, it is possible to prolong the operating time of the plasma processing apparatus 1 and to extend a mean time between cleaning (MTBC) related to the plasma processing apparatus 1.

Conventionally, when a dry cleaning process is performed by using a dummy wafer, the dummy wafer is required to be disposed at an accurate position with respect to the electrostatic chuck 13, i.e., at a position where a center of the dummy wafer and the center of the electrostatic chuck 13 coincide with each other in a plan view. Therefore, the technique of disposing the dummy wafers D1 to D4 by intentionally shifting the positions thereof with respect to the electrostatic chuck 13 as in the first embodiment is an extremely novel technique, which is not found in the conventional technical idea.

Figure 9:
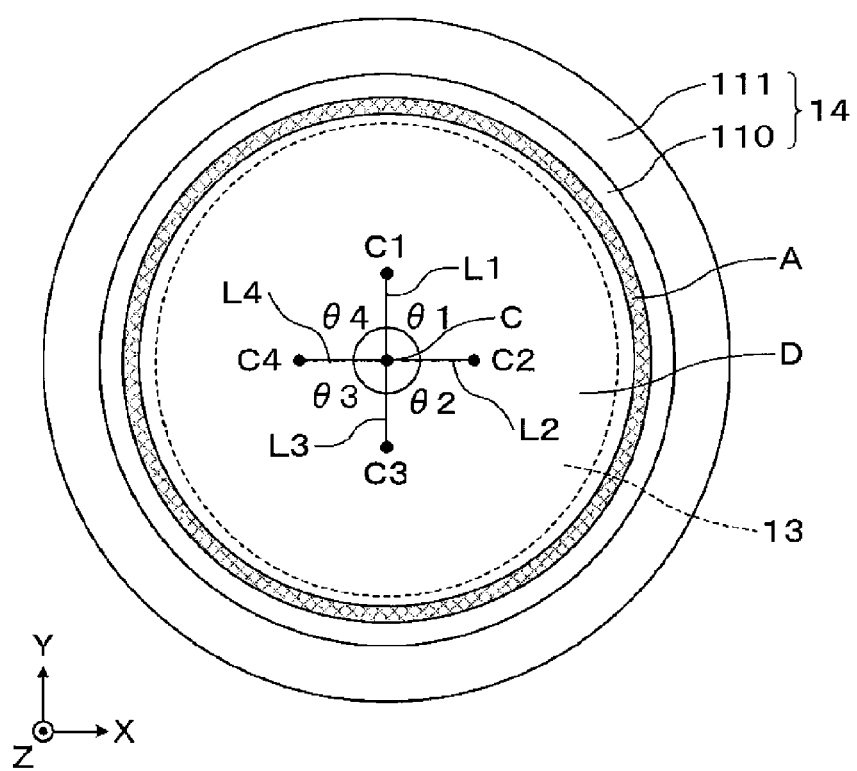
FIG. 9 is an explanatory diagram of first to fourth positions in the first embodiment.

As described above, in the first embodiment, the first to fourth dry cleaning processes are performed in a state in which the first to fourth dummy wafers D1 to D4 are disposed at the first to fourth positions, respectively. FIG. 9 is an explanatory diagram showing the first to fourth positions. In FIG. 9, a first line segment L1 is a line segment connecting the center C of the electrostatic chuck 13 and the center C1 of the first dummy wafer D1. A second line segment L2 is a line segment connecting the center C of the electrostatic chuck 13 and the center C2 of the second dummy wafer D2. A third line segment L3 is a line segment connecting the center C of the electrostatic chuck 13 and the center C3 of the third dummy wafer D3. A fourth line segment L4 is a line segment connecting the center C of the electrostatic chuck 13 and the center C4 of the fourth dummy wafer D4. A first angle $\theta 1$ is an angle formed by the first line segment L1 and the second line segment L2. A second angle $\theta 2$ is an angle formed by the second line segment L2 and the third line segment L3. A third angle $\theta 3$ is an angle formed by the third line segment L3 and the fourth line segment L4. A fourth angle $\theta 4$ is an angle formed by the fourth line segment L4 and the first line segment L1. The first to fourth angles $\theta 1$ to $\theta 4$ are equal to one another, i.e., 90 degrees, respectively. In other words, the centers C1 to C4 of the first to fourth dummy wafers D1 to D4 are disposed on the same circumference at equal intervals.

In such a case, the first to fourth shadow regions A1 to A4 can be made uniform. As a result of diligent studies conducted by the present inventors, it was found that the first to fourth shadow regions A1 to A4 can cover the entire shadow region A. In other words, when the first to fourth dry cleaning processes are performed, the entire shadow region A is exposed so that the deposits adhering to the shadow region A can be removed.

Modification of First Embodiment

Figure 10:
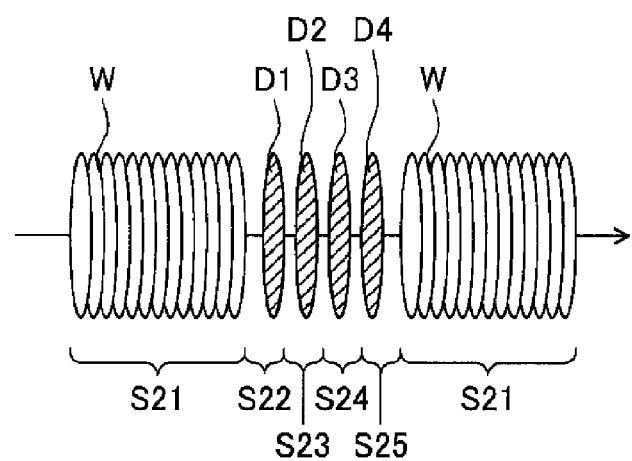
FIG. 10 is an explanatory diagram showing a series of flow of wafer processing according to a modification of the first embodiment through the use of wafers.

In the above-described first embodiment, after the plasma processing is performed on one lot of product wafers W, the first to fourth dry cleaning processes may be consecutively performed. FIG. 10 is an explanatory diagram showing a series of flow of wafer processing according to this modification through the use of wafers.

(Step S21)

In step S21, plasma processing is continuously performed on one lot of product wafers W, for example, twenty-five product wafers W. This step S21 is the same as step S11.

(Steps S22 to S25)

In step S22, the first dry cleaning process is performed by using the first dummy wafer D1. In step S23, the second dry cleaning process is performed by using the second dummy wafer D2. In step S24, the third dry cleaning process is performed by using the third dummy wafer D3. In step S25, the fourth dry cleaning process is performed by using the fourth dummy wafer D4. These steps S22 to S25 are consecutively performed, and are the same as steps S12, S14, S16, and S18, respectively.

Figure 11:
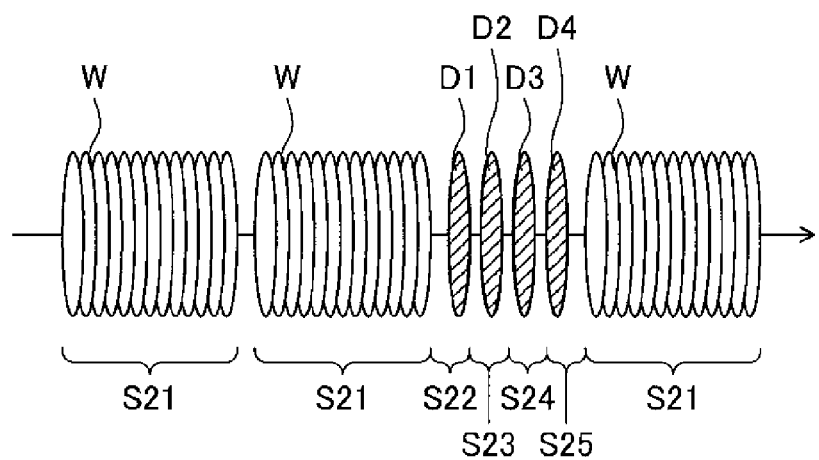
FIG. 11 is an explanatory diagram showing a series of flow of wafer processing according to a modification of the first embodiment through the use of wafers.

After step S25, for example, steps S21 to S25 are repeated. Further, as shown in FIG. 11, steps S22 to S25 may be performed after step S21 is performed a plurality of times, i.e., after plasma processing is performed on a plurality of lots of product wafers W.

Also in this modification, the same effects as those of the first embodiment can be achieved. That is, by performing the first to fourth dry cleaning processes, it is possible to remove the deposits adhering to the first to fourth shadow regions A1 to A4, respectively.

Modification of First Embodiment

Figure 12:
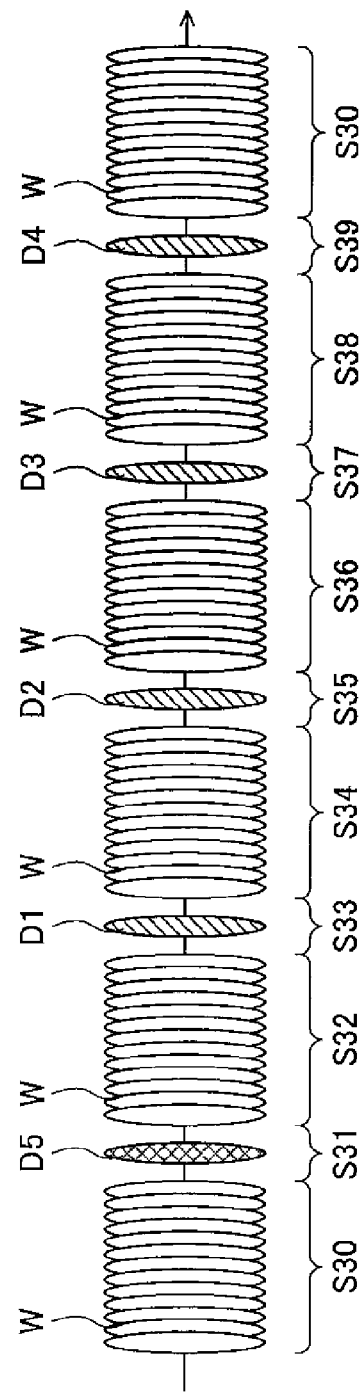
FIG. 12 is an explanatory diagram showing a series of flow of wafer processing according to a modification of the first embodiment through the use of wafers.

In the above-described first embodiment, the first to fourth dry cleaning processes may be individually performed between performing the plasma processing on one lot of product wafers W, after performing a fifth dry cleaning process which is different from the first to fourth dry cleaning processes. FIG. 12 is an explanatory diagram showing a series of flow of wafer processing according to this modification through the use of wafers.

(Step S30)

In step S30, plasma processing is continuously performed on one lot of product wafers W, for example, twenty-five product wafers W. This step S30 is the same as step S11.

(Step S31)

In step S31, the fifth dry cleaning process is performed by using a fifth dummy wafer D5. Specifically, first, the fifth dummy wafer D5 is disposed above the electrostatic chuck 13. At this time, the fifth dummy wafer D5 is disposed so that a center of the fifth dummy wafer D5 is located at the same position as the center of the electrostatic chuck 13 in a plan view. This position of the fifth dummy wafer D5 is a fifth position in the present disclosure.

Subsequently, the fifth dummy wafer D5 is mounted on the electrostatic chuck 13, and is attracted and held by the electrostatic chuck 13. Subsequent procedures in the fifth dry cleaning process are the same as in the first dry cleaning of step S12. That is, the deposits existing inside the chamber 10 are removed by the plasma (including radicals and ions) obtained by exciting a dry cleaning gas. The fifth dry cleaning process is performed as described above.

(Step S32)

In step S32, plasma processing is continuously performed on one lot of product wafers W, for example, twenty-five product wafers W. This step S32 is the same as step S11.

(Step S33)

In step S33, the first dry cleaning process is performed by using the first dummy wafer D1. This step S33 is the same as step S12.

(Step S34)

In step S34, plasma processing is continuously performed on one lot of product wafers W, for example, twenty-five product wafers W. This step S34 is the same as step S11.

(Step S35)

In step S35, the second dry cleaning process is performed by using the second dummy wafer D2. This step S35 is the same as step S14.

(Step S36)

In step S36, plasma processing is continuously performed on one lot of product wafers W, for example, twenty-five product wafers W. This step S36 is the same as step S11.

(Step S37)

In step S37, the third dry cleaning process is performed by using the third dummy wafer D3. This step S37 is the same as step S16.

(Step S38)

In step S38, plasma processing is continuously performed on one lot of product wafers W, for example, twenty-five product wafers W. This step S38 is the same as step S11.

(Step S39)

In step S39, the fourth dry cleaning process is performed by using the fourth dummy wafer D4. This step S39 is the same as step S18.

After step S39, for example, steps S30 to S39 are repeated.

Also in this modification, the same effects as those of the first embodiment can be achieved. That is, by performing the first to fourth dry cleaning processes, it is possible to remove the deposits adhering to the first to fourth shadow regions A1 to A4, respectively.

In step S31 of this modification, the fifth dummy wafer D5 is used to perform the fifth dry cleaning process. Alternatively, so-called wafer-less dry cleaning may be performed.

Modification of First Embodiment

Figure 13:
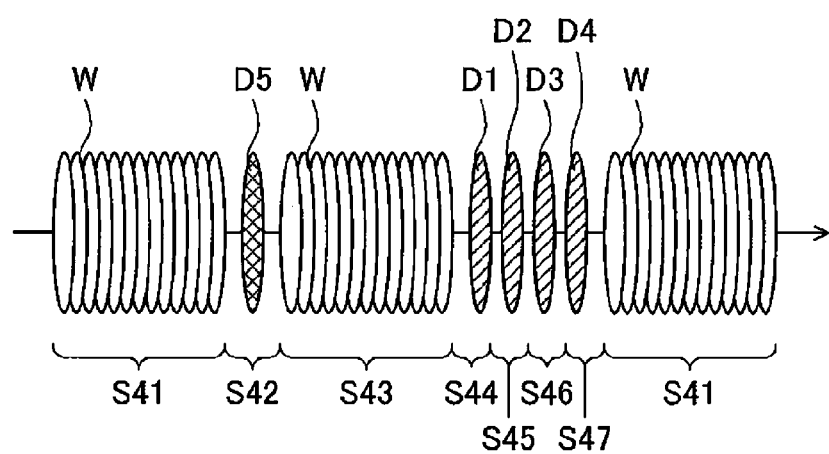
FIG. 13 is an explanatory diagram showing a series of flow of wafer processing according to a modification of the first embodiment through the use of wafers.

In the above-described first embodiment, after performing the fifth dry cleaning process which is different from the first to fourth dry cleaning processes and then performing plasma processing on another lot of product wafers W, the first to fourth dry cleaning processes may be performed consecutively. FIG. 13 is an explanatory diagram showing a series of flow of wafer processing according to this modification through the use of wafers.

(Step S41)

In step S41, plasma processing is continuously performed on one lot of product wafers W, for example, twenty-five product wafers W. This step S41 is the same as step S11.

(Step S42)

In step S42, the fifth dry cleaning process is performed by using the fifth dummy wafer D5. This step S42 is the same as step S31.

(Step S43)

In step S43, plasma processing is continuously performed on one lot of product wafers W, for example, twenty-five product wafers W. This step S43 is the same as step S11.

(Steps S44 to S47)

In step S44, the first dry cleaning process is performed by using the first dummy wafer D1. In step S45, the second dry cleaning process is performed by using the second dummy wafer D2. In step S46, the third dry cleaning process is performed by using the third dummy wafer D3. In step S47, the fourth dry cleaning process is performed by using the fourth dummy wafer D4. These steps S44 to S47 are consecutively performed, and are the same as steps S12, S14, S16, and S18, respectively.

After step S47, for example, steps S41 to S47 are repeated.

Also in this modification, the same effects as those of the first embodiment can be achieved. That is, by performing the first to fourth dry cleaning processes, it is possible to remove the deposits adhering to the first to fourth shadow regions A1 to A4, respectively.

Steps S44 to S47 may be performed after steps S42 and S43 are performed a plurality of times, i.e., after the plasma processing is performed on a plurality of lots of product wafers W. In such a case, when steps S42 and S43 are performed a plurality of times, deposits that cannot be removed in step S42 are deposited in the shadow region A. Therefore, the deposits existing in the shadow region A can be removed by performing the first to fourth dry cleaning processes in steps S43 to S47, respectively.

Further, in step S42 of this modification, although the fifth dummy wafer D5 is used to perform the fifth dry cleaning process, the so-called wafer-less dry cleaning may be performed.

Modification of First Embodiment

In the first embodiment and its modifications described above, the first to fourth dry cleaning processes are performed in the state in which the first to fourth dummy wafers D1 to D4, respectively, are mounted on the electrostatic chuck 13. Alternatively, the first to fourth dry cleaning processes may be performed in a state in which the first to fourth dummy wafers D1 to D4, respectively, are spaced apart from the electrostatic chuck 13. Hereinafter, the first dry cleaning process using the first dummy wafer D1 will be described. However, the same applies to the second to fourth dry cleaning processes.

Figure 14A:
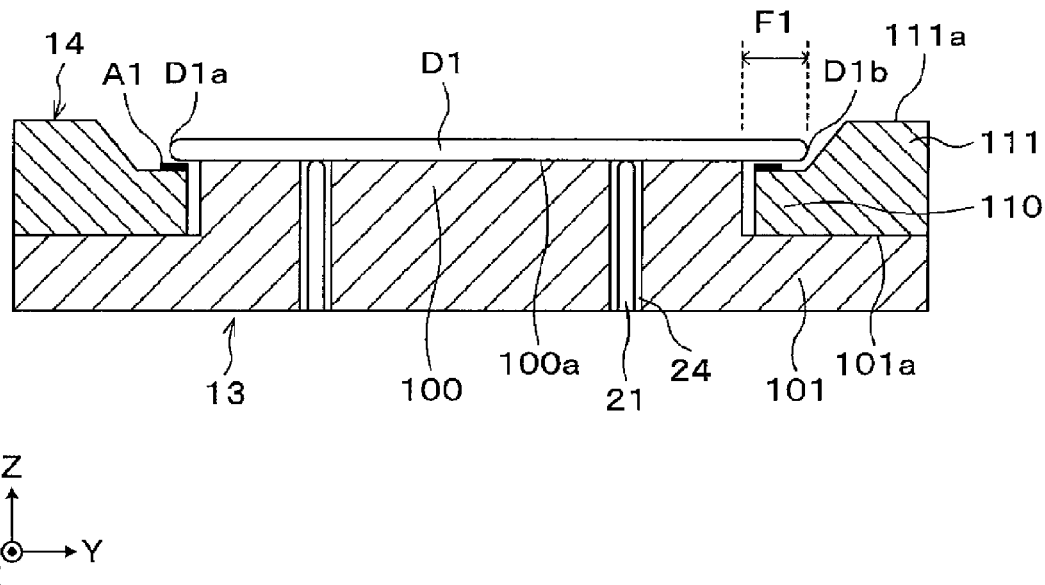
FIGS. 14A and 14B are explanatory diagrams showing states of a first dummy wafer in a modification of the first embodiment.

For example, as shown in FIG. 14A, in the edge ring 14, the first ring portion 110 may have a small size in a radial direction. In such a case, even when the first dummy wafer D1 is disposed at the first position to perform the first dry cleaning process, a distance F1 between the second end D1b and the outer peripheral end of the central portion 100 of the electrostatic chuck 13 cannot be sufficiently secured, and the first end D1a is located above the edge ring 14. That is, in the edge ring 14, the shadow region A1 on the side of the first end D1a overlaps with the first dummy wafer D1 in a plan view and is not completely exposed.

Figure 14B:
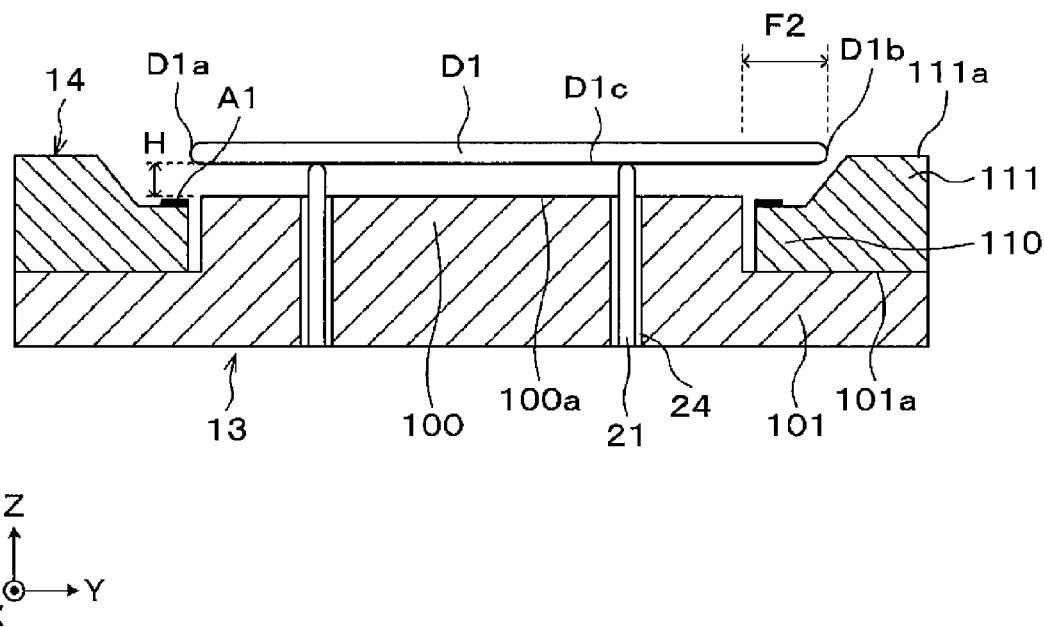

Therefore, as shown in FIG. 14B, the first dry cleaning process may be performed in a state in which the first dummy wafer D1 is supported by the lifter 20 and spaced apart from the electrostatic chuck 13. In such a case, a distance (margin) F2 between the second end D1b of the first dummy wafer D1 and the outer peripheral end of the central portion 100 of the electrostatic chuck 13 can be sufficiently secured, and the first end D1a is located between the inner peripheral end of the edge ring 14 and the outer peripheral end of the central portion 100 of the electrostatic chuck 13. Thus, in the edge ring 14, the shadow region A1 on the side of the first end D1a is exposed without overlapping with the first dummy wafer D1, and the deposits adhering to the shadow region A1 can be removed in the first dry cleaning process. In this modification, as described above, the inner peripheral portion of the surface 111a of the second ring portion 111 of the edge ring 14 is inclined toward the surface 110a.

As a result of diligent studies conducted by the present inventors, it was found that a distance H between a back surface D1c of the first dummy wafer D1 and the front surface of the electrostatic chuck 13 shown in FIG. 14B is desirably 2 mm or less. That is, when the distance H is 2 mm or less, a state of plasma does not change in the first dry cleaning process, and the same cleaning effect as in the state in which the first dummy wafer D1 is mounted on the electrostatic chuck 13 can be achieved.

Similarly, the second to fourth dry cleaning processes are also performed in a state in which the second to fourth dummy wafers D2 to D4 are supported by the lifter 20 and spaced apart from the electrostatic chuck 13. By doing so, the shadow regions A2 to A4 are exposed, and the deposits adhering to the shadow regions A2 to A4 can be removed in the second to fourth dry cleaning processes, respectively.

Also in this modification, the same effects as those of the first embodiment can be achieved. That is, by performing the first to fourth dry cleaning processes, it is possible to remove the deposits adhering to the first to fourth shadow regions A1 to A4, respectively.

In the first embodiment and its modifications described above, the first to fourth dry cleaning processes are performed to expose the shadow regions A1 to A4, respectively, and to remove the deposits. However, the number of dry cleaning processes is not limited thereto. The number of dry cleaning processes may be at least two. For example, when performing the dry cleaning process twice, the first dry cleaning process and the third dry cleaning process described above may be performed.

Further, in the first embodiment and its modifications described above, the number of one lot of product wafers W to be subjected to the plasma processing is twenty-five. However, the number of one lot of product wafers W is not limited thereto. For example, one lot of product wafers may be two or more product wafers, or may be one product wafer.

<Dry Cleaning Method of Second Embodiment>

A dry cleaning method according to a second embodiment will be described. In the second embodiment, plasma processing for product wafers W and a dry cleaning process using a small-diameter dummy wafer Ds will be described.

Figure 15:
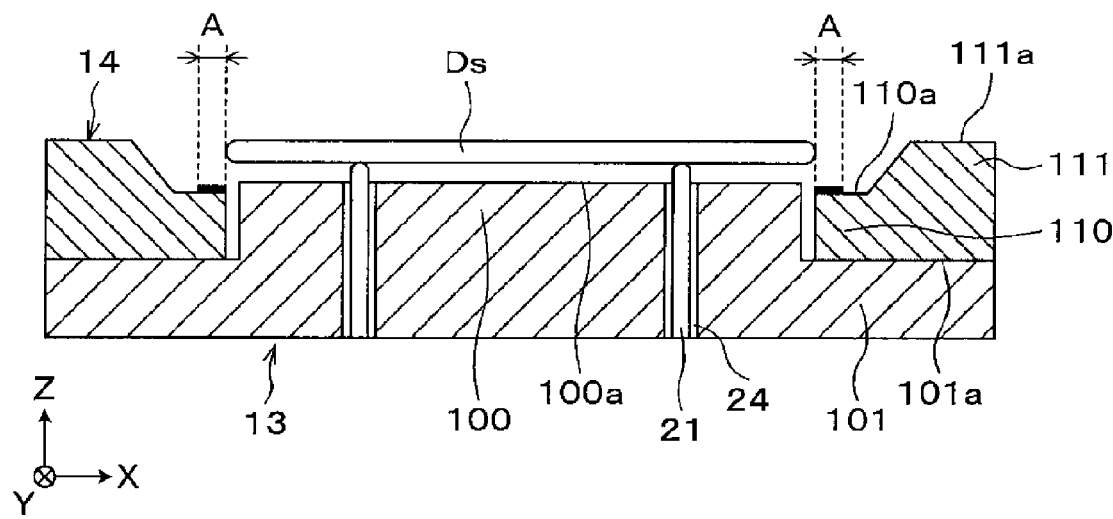
FIG. 15 is a vertical cross-sectional view showing an outline of configurations of a small-diameter dummy wafer, an electrostatic chuck, and an edge ring according to a second embodiment.
Figure 16:
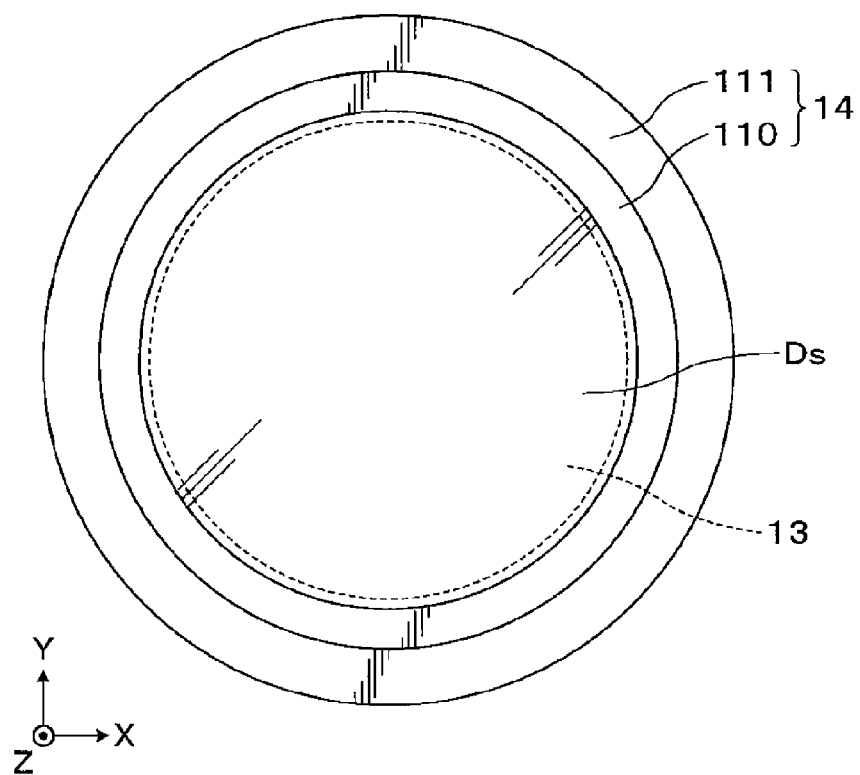
FIG. 16 is a plan view showing the outline of the configurations of the small-diameter dummy wafer, the electrostatic chuck, and the edge ring according to the second embodiment.

As described above, the small-diameter dummy wafer Ds used in the dry cleaning process of the second embodiment is a wafer having a diameter smaller than that of the product wafers W. FIG. 15 is a vertical cross-sectional view showing an outline of configurations of the small-diameter dummy wafer Ds, the electrostatic chuck 13, and the edge ring 14. FIG. 16 is a plan view showing an outline of the configurations of the small-diameter dummy wafer Ds, the electrostatic chuck 13, and the edge ring 14.

As shown in FIGS. 15 and 16, the diameter of the small-diameter dummy wafer Ds is equal to an inner diameter of the edge ring 14. In such a case, the shadow region A is exposed without overlapping with the small-diameter dummy wafer Ds in a plan view. The diameter of the small-diameter dummy wafer Ds is not limited to the illustrated example. The diameter of the small-diameter dummy wafer Ds may be equal to or larger than a diameter of the central portion 100 of the electrostatic chuck 13 and may be equal to or smaller than the diameter of the product wafer W.

Figure 17:
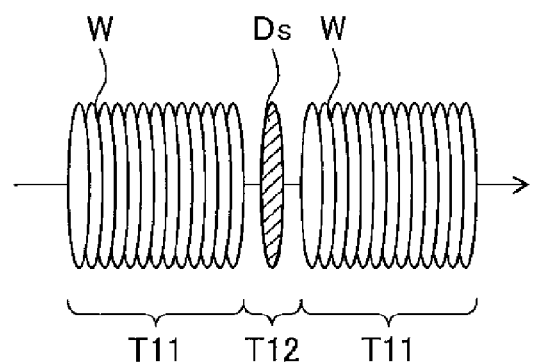
FIG. 17 is an explanatory diagram showing a series of flow of wafer processing according to a second embodiment through the use of wafers.

FIG. 17 is an explanatory diagram showing a series of flow of wafer processing according to the second embodiment through the use of wafers.

(Step T11)

In step T11, plasma processing is continuously performed on one lot of product wafers W, for example, twenty-five product wafers W. This step T11 is the same as step S11.

(Step T12)

In step T12, a dry cleaning process is performed by using the small-diameter dummy wafer Ds. Specifically, first, the small-diameter dummy wafer Ds is disposed above the electrostatic chuck 13. At this time, the small-diameter dummy wafer Ds is disposed so that a center of the small-diameter dummy wafer Ds is located at the same position as the center of the electrostatic chuck 13 in a plan view. This position of the small-diameter dummy wafer Ds is a cleaning position in the present disclosure. In such a case, the shadow region A of the edge ring 14 is exposed without overlapping with the small-diameter dummy wafer Ds in a plan view.

Subsequently, the small-diameter dummy wafer Ds is mounted on the electrostatic chuck 13, and is attracted and held by the electrostatic chuck 13. Subsequent procedures in the dry cleaning process are the same as in the first dry cleaning process of step S12. That is, the deposits existing inside the chamber 10 are removed by the plasma (including radicals and ions) generated by exciting a dry cleaning gas. At this time, the deposits adhering to the shadow region A exposed from the small-diameter dummy wafer Ds are also removed. The dry cleaning process is performed as described above.

Figure 18:
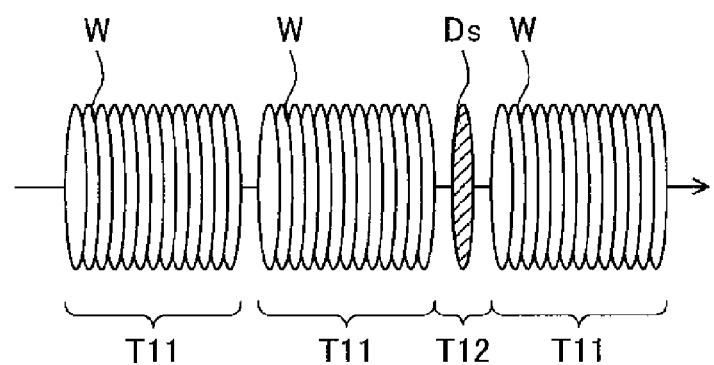
FIG. 18 is an explanatory diagram showing a series of flow of wafer processing according to a modification of the second embodiment through the use of wafers.

After step T11, for example, steps T11 and T12 are repeated. Further, as shown in FIG. 18, step T12 may be performed after step T11 is performed a plurality of times, i.e., after plasma processing is performed on a plurality of lots of product wafers W.

As described above, in the second embodiment, the deposits adhering to the shadow region A can be removed by performing the dry cleaning process through the use of the small-diameter dummy wafer Ds. That is, the deposits can be appropriately removed even in the shadow region A where the deposits cannot conventionally be removed due to the shadow of the dummy wafer D as shown in FIG. 4. In the second embodiment, on the surfaces 110a and 111a of the edge ring 14, portions other than the shadow region A are exposed so that the deposits adhering to these portions can be appropriately removed. Therefore, since the deposits can be removed over the entire surfaces 110a and 111a of the edge ring 14, generation of particles can be suppressed, yield of products can be improved, and the operating time of the plasma processing apparatus 1 can be prolonged.

As a result of diligent studies conducted by the present inventors, it was confirmed that with respect to a diameter φA of the small-diameter dummy wafer Ds, deposits on a side radially outward than a radius (φA/2-0.4) mm can be appropriately removed and the effect of dry cleaning can be achieved. Here, in the small-diameter dummy wafer Ds, an annular range of 0.4 mm in the radial direction coincides with a bevel portion (chamfered portion). Therefore, it can be inferred that the cleaning effect can be achieved even in a region below the small-diameter dummy wafer Ds when the region is below the bevel portion.

A lower limit of the diameter φA of the small-diameter dummy wafer Ds is determined by a range in which an incident effect of radicals and ions on the central portion 100 of the electrostatic chuck 13 does not occur, i.e., by {(outer diameter of central portion 100 of electrostatic chuck 13)/2}≤(φA/2-0.4). In general, (outer diameter of central portion 100 of electrostatic chuck 13)≤(inner diameter of edge ring 14). Therefore, the left-hand side inequality of equation (1) below is established. Further, an upper limit of the diameter φA of the small-diameter dummy wafer Ds is determined by the radius of the product wafer W, i.e., by the right-hand side inequality of equation (1) below.

{(inner diameter of edge ring 14)/2}≤{(diameter φA
of small-diameter dummy wafer Ds)/2−(bevel
length)}≤{(diameter of product wafer W)/2}     (1)

Further, as a result of diligent studies conducted by the present inventors, it was confirmed that when the dry cleaning process is performed in a state in which the small-diameter dummy wafer Ds is supported by the lifter 20 and spaced apart from the electrostatic chuck 13 as shown in FIG. 14B, a dry cleaning effect can be achieved even on a side radially inward of the bevel portion. That is, in such a case, a dry cleaning effect can be achieved on a side radially outward than a radius of (φA/2−X) mm (where X is longer than the bevel length of 0.4 mm). As described above, it is inferred that the reason for the increase in the range in which the dry cleaning effect is obtained as compared to the case in which the small-diameter dummy wafer Ds is not lifted up is that the range in which radicals and ions can be incident is increased when the small-diameter dummy wafer Ds is lifted up. Therefore, the dry cleaning process may be performed in a state in which the small-diameter dummy wafer Ds is lifted up.

Modification of Second Embodiment

Figure 19:
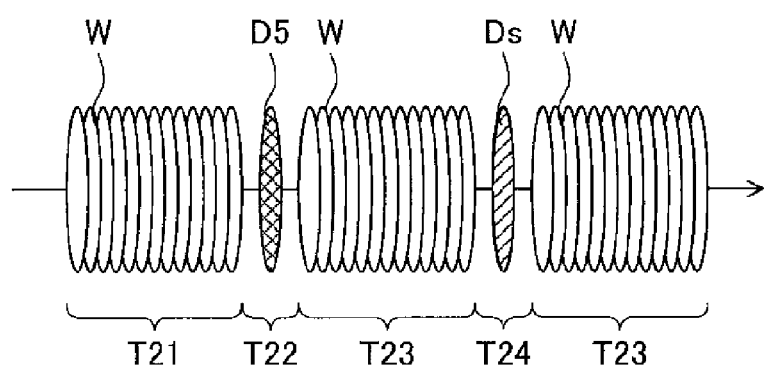
FIG. 19 is an explanatory diagram showing a series of flow of wafer processing according to a modification of the second embodiment through the use of wafers.

In the second embodiment described above, the dry cleaning process using the small-diameter dummy wafer Ds may be performed after performing a typical dry cleaning process and then performing plasma processing on another lot of product wafers W. FIG. 19 is an explanatory diagram showing a series of flow of wafer processing according to this modification through the use of wafers.
(Step T21)
In step T21, plasma processing is continuously performed on one lot of product wafers W, for example, twenty-five product wafers W. This step T21 is the same as step S11.
(Step T22)
In step T22, the fifth dry cleaning process (typical dry cleaning process) is performed by using the fifth dummy wafer D5. This step T22 is the same as step S31.
(Step T23)
In step T23, plasma processing is continuously performed on one lot of product wafers W, for example, twenty-five product wafers W. This step T23 is the same as step S11.
(Step T24)
In step T24, a dry cleaning process is performed by using the small-diameter dummy wafer Ds. This step T24 is the same as step T12.

After step T24, for example, steps T23 and T24 are repeated.

Also in this modification, the same effects as those of the second embodiment can be achieved. That is, by performing the dry cleaning process through the use of the small-diameter dummy wafer Ds, it is possible to remove the deposits adhering to the shadow region A.

Step T24 may be performed after steps T22 and T23 are performed a plurality of times, i.e., after plasma processing is performed on a plurality of lots of product wafers W. In such a case, when steps T22 and T23 are performed a plurality of times, deposits that cannot be removed in step T22 are deposited in the shadow region A. Therefore, the deposits existing in the shadow region A can be removed by performing the dry cleaning process in step T24 through the use of the small-diameter dummy wafer Ds.

Further, in step T22 of this modification, although the fifth dummy wafer D5 is used to perform the fifth dry cleaning process, the so-called wafer-less dry cleaning may be performed.

<Supplementary Notes>
[Supplementary Note 1]
A method of cleaning a plasma processing apparatus, the method including:
(a) mounting a product substrate at a processing position with respect to a stage inside a chamber and performing plasma processing on the product substrate; and
(b) disposing a first dummy substrate having a diameter equal to or smaller than a diameter of the product substrate at a first position with respect to the stage inside the chamber and performing a first dry cleaning process inside the chamber,
wherein each of a center of the processing position and a center of the first position is located at the same position as a center of the stage in a plan view.
[Supplementary Note 2]
The method of Supplementary Note 1, wherein (b) is performed after (a) is performed a plurality of times.
[Supplementary Note 3]
The method of Supplementary Note 1 or 2, further including:
(c) disposing a second dummy substrate at a second position with respect to the stage inside the chamber and performing a second dry cleaning process inside the chamber,
wherein a diameter of the second dummy substrate is the same as the diameter of the product substrate, and
wherein a center of the second position is the same position as the center of the stage in a plan view.
[Supplementary Note 4]
The method of Supplementary Note 3, including:
a first sequence in which (c) is performed after (a) is performed a plurality of times; and
a second sequence in which (b) is performed after (a) is performed a plurality of times,
wherein the second sequence is performed after the first sequence is performed a plurality of times.
[Supplementary Note 5]
The method of Supplementary Note 1 or 2, further including:
(d) performing a second dry cleaning process inside the chamber without mounting a dummy substrate on the stage inside the chamber.
[Supplementary Note 6]
The method of Supplementary Note 5, including:
a first sequence in which (d) is performed after (a) is performed a plurality of times; and
a second sequence in which (b) is performed after (a) is performed a plurality of times,
wherein the second sequence is performed after the first sequence is performed a plurality of times.
[Supplementary Note 7]
The method of any one of Supplementary Notes 1 to 6, wherein the stage includes an electrostatic chuck configured to hold the product substrate, and
wherein the diameter of the first dummy substrate is equal to or larger than a diameter of a portion of the electrostatic chuck on which the product substrate is mounted and held, and is equal to or smaller than the diameter of the product substrate.

The plasma processing apparatus 1 of the above-described embodiments is a capacitively-coupled plasma processing apparatus. However, the plasma processing apparatus to which the present disclosure is applied is not limited thereto. For example, the plasma processing apparatus may be an inductively-coupled plasma processing apparatus.

According to the present disclosure, it is possible to appropriately dry-clean the stage, on which the substrate is mounted, inside the chamber of the plasma processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of cleaning a plasma processing apparatus, the method comprising:
   disposing a first dummy substrate at a first position with respect to a stage inside a chamber and performing a first dry cleaning process of cleaning an inside of the chamber with the first dummy substrate disposed at the first position; and
   disposing a second dummy substrate at a second position with respect to the stage inside the chamber and performing a second dry cleaning process of cleaning the inside of the chamber with the second dummy substrate disposed at the second position,
   wherein each of a center of the first position and a center of the second position is located at a different position from a center of the stage in a plan view, and
   wherein the first position and the second position are different from each other in a plan view.

2. The method of claim 1, wherein at least the first dry cleaning process or the second dry cleaning process is performed in a state in which the first dummy substrate or the second dummy substrate is supported by a lifter and spaced apart from the stage.

3. The method of claim 2, wherein at least in the first dry cleaning process or the second dry cleaning process, a distance between a back surface of the first dummy substrate or a back surface of the second dummy substrate and a front surface of the stage is 2 mm or less.

4. The method of claim 3, wherein the stage includes an electrostatic chuck configured to hold the first dummy substrate or the second dummy substrate, and an edge ring provided so as to surround the first dummy substrate or the second dummy substrate mounted on the electrostatic chuck, and
   wherein at least in the first dry cleaning process or the second dry cleaning process, a first end of the first dummy substrate or the second dummy substrate in a plan view is located between an inner peripheral end of the edge ring and an outer peripheral end of the electrostatic chuck, and a second end of the first dummy substrate or the second dummy substrate in a plan view is located outward of the inner peripheral end of the edge ring.

5. The method of claim 4, wherein the first dummy substrate and the second dummy substrate are the same dummy substrate.

6. The method of claim 1, wherein at least the first dry cleaning process or the second dry cleaning process is performed in a state in which the first dummy substrate or the second dummy substrate is mounted on the stage.

7. The method of claim 1, wherein the stage includes an electrostatic chuck configured to hold the first dummy substrate or the second dummy substrate, and an edge ring provided so as to surround the first dummy substrate or the second dummy substrate mounted on the electrostatic chuck, and
   wherein at least in the first dry cleaning process or the second dry cleaning process, a first end of the first dummy substrate or the second dummy substrate in a plan view is located between an inner peripheral end of the edge ring and an outer peripheral end of the electrostatic chuck, and a second end of the first dummy substrate or the second dummy substrate in a plan view is located outward of the inner peripheral end of the edge ring.

8. The method of claim 1, wherein the first dummy substrate and the second dummy substrate are the same dummy substrate.

9. The method of claim 1, wherein the first dummy substrate and the second dummy substrate are different dummy substrates.

10. The method of claim 1, wherein plasma processing on a product substrate is performed between the first dry cleaning process and the second dry cleaning process, and
    wherein the plasma processing is performed in a state in which the product substrate is mounted on the stage so that a center of the product substrate and the center of the stage are located at the same position in a plan view.

11. The method of claim 10, wherein the plasma processing is performed a plurality of times between the first dry cleaning process and the second dry cleaning process.

12. The method of claim 1, wherein the first dry cleaning process and the second dry cleaning process are performed consecutively.

13. The method of claim 1, wherein at least the first dry cleaning process or the second dry cleaning process is performed in a state in which radio frequency power is supplied to the stage.

14. The method of claim 1, further comprising:
    disposing a third dummy substrate at a third position with respect to the stage inside the chamber and performing a third dry cleaning process inside the chamber,
    wherein a center of the third position is located at a different position from the center of the stage in a plan view, and
    wherein the third position is a different position from the first position and the second position in a plan view.

15. The method of claim 14, further comprising:
    disposing a fourth dummy substrate at a fourth position with respect to the stage inside the chamber and performing a fourth dry cleaning process inside the chamber,
    wherein a center of the fourth position is located at a different position from the center of the stage in a plan view, and
    wherein the fourth position is a different position from the first position, the second position, and the third position in a plan view.

16. The method of claim 15, wherein a first angle formed by a first line segment connecting the center of the stage and the center of the first position and a second line segment connecting the center of the stage and the center of the second position, a second angle formed by the second line segment and a third line segment connecting the center of the stage and the center of the third position, a third angle formed by the third line segment and a fourth line segment connecting the center of the stage and the center of the fourth position, and a fourth angle formed by the fourth line segment and the first line segment, are equal to one another.

17. The method of claim 15, further comprising:
disposing a fifth dummy substrate at a fifth position with respect to the stage inside the chamber and performing a fifth dry cleaning process inside the chamber; and
performing plasma processing on a product substrate after the fifth dry cleaning process is performed,
wherein a center of the fifth position is located at the same position as the center of the stage in a plan view,
wherein the plasma processing is performed in a state in which the product substrate is mounted on the stage so that a center of the product substrate and the center of the stage are located at the same position in a plan view, and
wherein each of the first dry cleaning process, the second dry cleaning process, the third dry cleaning process, and the fourth dry cleaning process is performed after the plasma processing.

18. The method of claim 15, further comprising:
disposing a fifth dummy substrate at a fifth position with respect to the stage inside the chamber and performing a fifth dry cleaning process inside the chamber; and
performing plasma processing on a product substrate after the fifth dry cleaning process is performed,
wherein a center of the fifth position is located at the same position as the center of the stage in a plan view,
wherein the plasma processing is performed in a state in which the product substrate is mounted on the stage so that a center of the product substrate and the center of the stage are located at the same position in a plan view, and
wherein the first dry cleaning process, the second dry cleaning process, the third dry cleaning process, and the fourth dry cleaning process are performed consecutively after the plasma processing.

19. A plasma processing apparatus, comprising:
a chamber;
a stage provided inside the chamber and configured to mount a first dummy substrate or a second dummy substrate on the stage;
a dry cleaning part configured to dry-clean an interior of the chamber; and
a controller configured to control the dry cleaning part,
wherein the controller controls the dry cleaning part so as to perform: disposing the first dummy substrate at a first position with respect to the stage inside the chamber and performing a first dry cleaning process of cleaning an inside of the chamber with the first dummy substrate disposed at the first position; and disposing the second dummy substrate at a second position with respect to the stage inside the chamber and performing a second dry cleaning process of cleaning the inside of the chamber with the second dummy substrate disposed at the second position,
wherein each of a center of the first position and a center of the second position is located at a different position from a center of the stage in a plan view, and
wherein the first position and the second position are different from each other in a plan view.

* * * * *